US007086913B2

(12) United States Patent
Myer et al.

(10) Patent No.: US 7,086,913 B2

(45) Date of Patent: Aug. 8, 2006

(54) SURFACE MOUNT HEADER ASSEMBLY HAVING A PLANAR ALIGNMENT SURFACE

(75) Inventors: John Mark Myer, Millersville, PA (US); Craig Maurice Campbell, Camp Hill, PA (US); Charles Randall Malstrom, Lebanon, PA (US); Daniel Williams Fry, Jr., Elizabethtown, PA (US); Hurley Chester Moll, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/066,852

(22) Filed: Feb. 25, 2005

(65) Prior Publication Data

US 2005/0142907 A1 Jun. 30, 2005

Related U.S. Application Data

(63) Continuation-in-part of application No. 10/718,371, filed on Nov. 20, 2003.

(51) Int. Cl.
*H01R 4/02* (2006.01)
*H01R 12/00* (2006.01)
*H05K 1/00* (2006.01)

(52) U.S. Cl. ........................................ 439/876; 439/78

(58) Field of Classification Search .................. 439/79, 439/76, 77, 78, 80, 81, 82, 83, 606, 876
See application file for complete search history.

(56) References Cited

U.S. PATENT DOCUMENTS

| | | | | |
|---|---|---|---|---|
| 4,762,500 | A | | 8/1988 | Dola et al. |
| 4,960,391 | A | | 10/1990 | Beinhaur et al. |
| 5,133,670 | A | * | 7/1992 | Doi et al. ..................... 439/79 |
| 5,281,160 | A | | 1/1994 | Walkup et al. |
| 5,336,116 | A | | 8/1994 | Boteler |
| 5,451,158 | A | | 9/1995 | Lin et al. |
| 5,487,674 | A | | 1/1996 | Guzik et al. |
| 5,667,393 | A | | 9/1997 | Grabbe et al. |
| 5,697,799 | A | | 12/1997 | Consoli et al. |
| 5,772,474 | A | | 6/1998 | Yagi et al. |
| 6,135,781 | A | | 10/2000 | Pope et al. |
| 6,338,630 | B1 | | 1/2002 | Dong |
| 6,361,332 | B1 | | 3/2002 | Froude et al. |
| 6,419,526 | B1 | | 7/2002 | Fair et al. |
| 6,827,588 | B1 | | 12/2004 | Huang et al. |
| 2005/0009379 | A1 | | 1/2005 | Huang et al. |

* cited by examiner

*Primary Examiner*—Chandrika Prasad

(57) ABSTRACT

A header assembly includes an insulative housing having a plurality of walls defining an interior cavity extending along a mating axis, and a plurality of contacts within the cavity and extending through one of the walls to an exterior of the housing for surface mounting to a circuit board. The insulative housing includes at least one alignment rib extending on an exterior surface thereof in a direction substantially perpendicular to the mating axis. The contacts are formed against and abutting the alignment rib, thereby ensuring coplanarity of the contacts for surface mounting to a circuit board.

20 Claims, 13 Drawing Sheets

SURFACE MOUNT HEADER ASSEMBLY HAVING A PLANAR ALIGNMENT SURFACE

CROSS REFERENCE TO RELATED APPLICATIONS

This application is a continuation-in-part application of U.S. patent application Ser. No. 10/718,371 filed Nov. 20, 2003, which is hereby incorporated by reference in its entirety.

BACKGROUND OF THE INVENTION

This invention relates generally to electrical connectors, and, more specifically, to surface mount header assemblies for mating engagement with plug assemblies.

The mating of a plug assembly into a receptacle assembly to form a connector assembly often involves a high insertion force. This is particularly true when the connector comprises mating connector housings containing many contacts. For example, automobile wiring systems, such as power train systems, typically include electrical connectors. Typically, each electrical connector includes a plug assembly and a header assembly. The plug assembly is mated into a shroud of the header assembly. The header assembly is in turn mounted on a circuit board along a contact interface. At least some known receptacle assemblies are right angle receptacle assemblies wherein the plug assembly is mated in a direction that is parallel to the contact interface between the header assembly and the circuit board. Each of the plug assembly and the header assembly typically includes a large number of electrical contacts, and the contacts in the header assembly are electrically and mechanically connected to respective contacts in the plug assembly when the header assembly and the plug assembly are engaged. To overcome the high insertion force to connect the plug assembly into the header assembly, an actuating lever is sometimes employed to mate contacts of the plug assembly and the header assembly.

Surface mount header assemblies provide a number of advantages over through-hole mounted header assemblies. In addition to offering cost and process advantages, surface mounting allows for a reduced footprint for the header assembly and thus saves valuable space on a circuit board or permits a reduction in size of the circuit board. When the header assembly is surface mounted to a circuit board, solder tails extend from one side of the header assembly in an angled manner for surface mounting to a circuit board, and also extend substantially perpendicular from another side of the header assembly for mating engagement with contacts of the plug assembly. In one automotive connector system, fifty two contacts are employed in one version of the header assembly, and the large number of contacts presents manufacturing and assembly challenges in fabricating the header assembly, as well as installation problems during surface mounting of the header assembly to the circuit board.

For example, it is desirable for surface mounting that the solder tails of the header assembly are coplanar to one another for mounting to the plane of a circuit board. Achieving coplanarity with a large number of contact pins, however, is difficult due to manufacturing tolerances over a large number of contacts. Sometimes additional solder paste is utilized to compensate for tolerances of the contacts or for misalignment of the pin contacts during assembly of the header. Over a large number of header assemblies, however, the incremental cost of the increased amount of solder paste per header assembly can be significant, and non-planarity of the pin contacts with respect to the plane of the circuit board may negatively affect the reliability of the header assembly. Additional solder paste thickness can also cause solder bridging problems for other surface mount components on fine pitch or may require different stencils to be used. Depending upon the degree of non-planarity of the solder tails, some of the contacts may be weakly connected or not connected to the circuit board at all, either of which is an undesirable and unacceptable result.

Furthermore, the high insertion forces during engagement and disengagement of the header assembly and the plug assembly may be detrimental to the soldered connections of the header assembly. To prevent the soldered connections from being broken, a solder clip is sometimes used which is soldered to the circuit board at the corners of the header. As such, the mechanical connection of the solder clips incur the brunt of mechanical strain as the header assembly is mated and unmated from a mating connector. Tolerances in manufacturing the solder clips, however, introduce additional non-planarity issues when the header assembly is soldered to a circuit board. At one end of the tolerance range, the solder clips may prevent the contacts from fully contacting the circuit board, which may impair the quality of the soldered connections of the contacts. At the other end of the tolerance range, the solder clips may not fully contact the circuit board during soldering, which may impair the ability of the solder clips to spare the contacts from large insertion and extraction forces as the header assembly is engaged and disengaged from a mating connector.

BRIEF DESCRIPTION OF THE INVENTION

In accordance with an exemplary embodiment, a header assembly comprises an insulative housing having a plurality of walls defining an interior cavity extending along a mating axis, and a plurality of contacts within the cavity and extending through one of the walls to an exterior of the housing for surface mounting to a circuit board. The insulative housing includes at least one alignment rib extending on an exterior surface thereof in a direction substantially perpendicular to the mating axis. The contacts are formed against and abutting the alignment rib, thereby ensuring coplanarity of the contacts for surface mounting to a circuit board.

Optionally, the housing includes longitudinal side walls and lateral side walls, wherein the alignment rib extends perpendicular to one of the longitudinal and lateral side walls. The contacts may include a first bend and a second bend, wherein one of said first and second bends is approximately 90°. Alternatively, one of the first and second bends is greater than 90°. The contacts may extend parallel to the mating axis within the cavity, substantially perpendicular to the mating axis exterior to the cavity, and oblique to the mating axis adjacent the alignment rib. Optionally, the contacts are preloaded against the alignment rib at an outer corner of the housing.

According to another exemplary embodiment, a header assembly for engaging an engagement surface of a circuit board is provided. The header assembly comprises an insulative housing having a plurality of walls defining an interior cavity, a contact interface opposite a plug interface, and at least one alignment rib at an exterior corner of the housing. A plurality of contacts include contact sections and solder tail sections, wherein the contact sections are located within the interior cavity. The solder tail sections extend exterior to the contact interface for surface mounting to a circuit board. The solder tail sections abut the alignment rib and are preloaded against the alignment rib as the contacts are installed into the housing, thereby ensuring coplanarity of the solder tail sections for surface mounting to the circuit board.

According to another exemplary embodiment, a method of assembling a surface mount header assembly is provided. The assembly includes an insulative housing including a plurality of walls defining an interior surface, an exterior surface and a plurality of contact apertures extending therebetween, the housing further includes an alignment member extending from the exterior surface. The alignment member includes at least one alignment rib extending on an exterior corner thereof. The assembly further includes a plurality of electrical contacts. The method comprises inserting the contacts through the contact apertures, forming a right angle bend in said contacts, and forming the contact around the alignment rib thereby preloading the contacts against the alignment rib in a coplanar relationship with one another along a single edge of the housing.

DETAILED DESCRIPTION OF THE INVENTION

Figure 1:
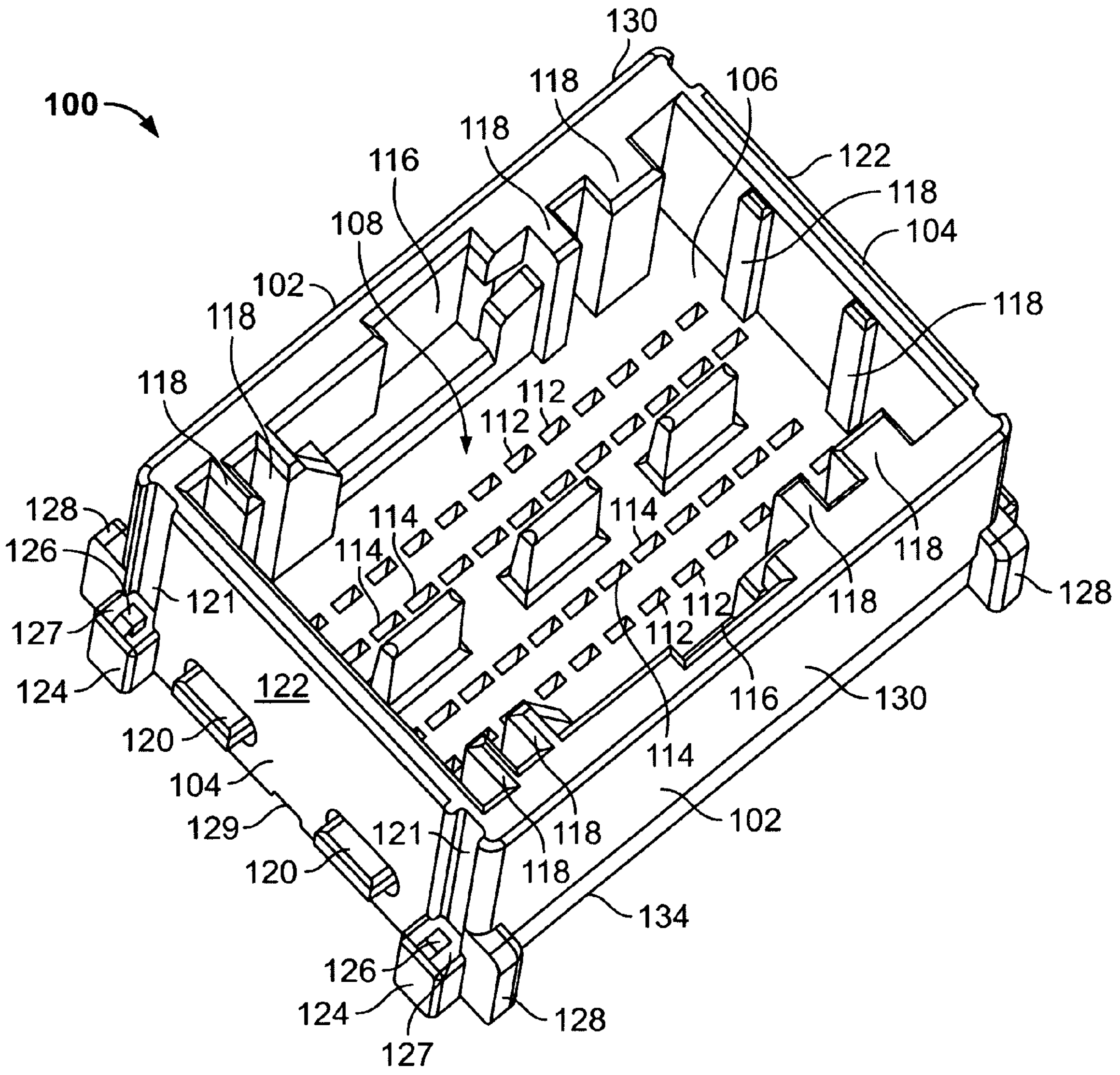
FIG. 1 is a top perspective view of a housing for a surface mount header assembly formed in accordance with an exemplary embodiment of the invention.
Figure 2:
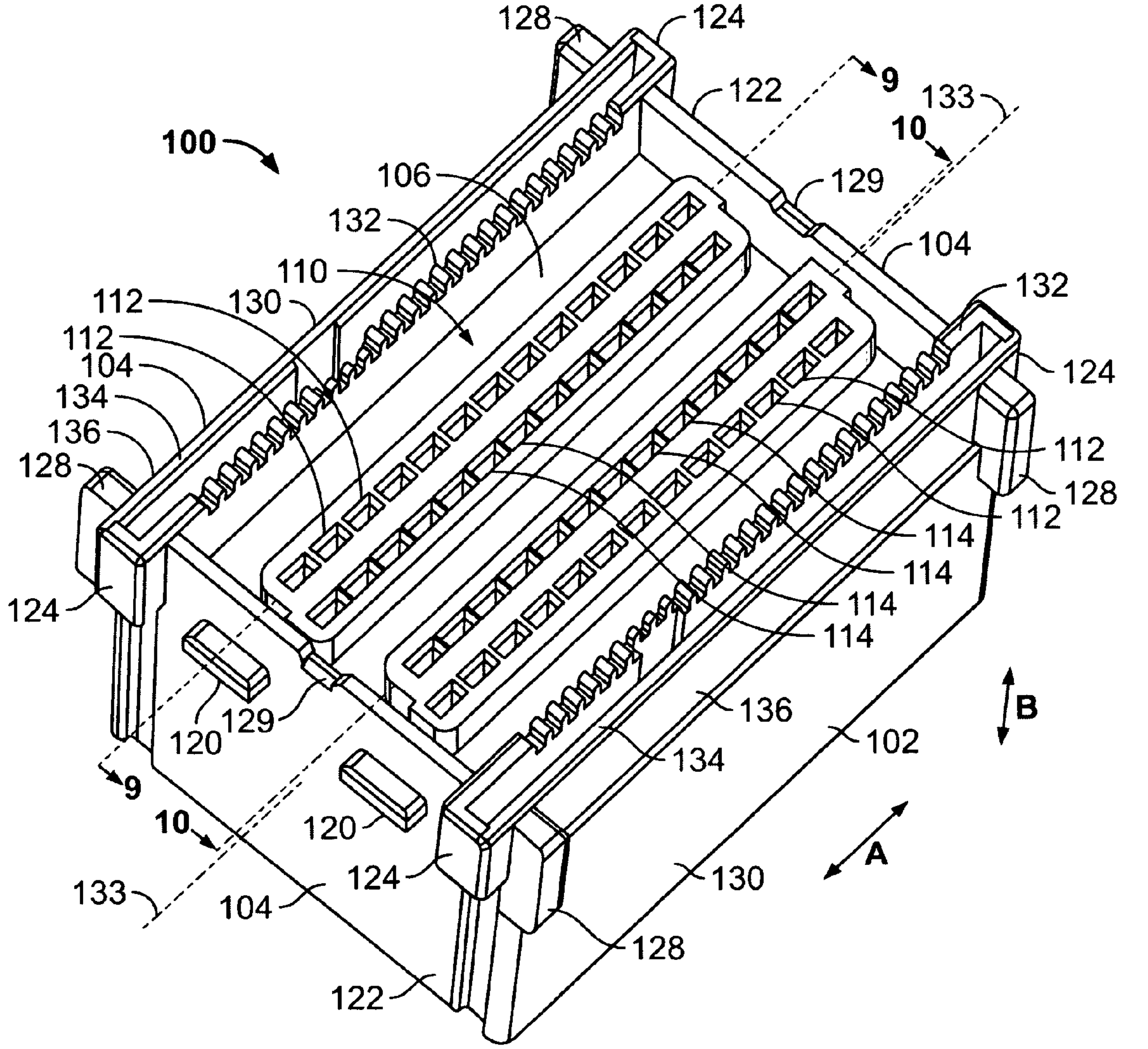
FIG. 2 is a bottom perspective view of the housing shown in FIG. 1.

FIGS. 1 and 2 are top and bottom perspective views, respectively, of a an exemplary housing 100, sometimes referred to as a shroud, for a surface mount header assembly formed in accordance with an exemplary embodiment of the invention.

The housing 100 includes a pair of longitudinal side walls 102, a pair of lateral side walls 104 extending between the ends of the longitudinal side walls 102, and a bottom wall 106 extending between the longitudinal and lateral side walls 102 and 104. The side walls 102 and 104 and the bottom wall 106 collectively define a contact cavity 108 in the top side of the housing 100 (FIG. 1), and a contact interface 110 on the bottom side of the housing 100 (FIG. 2). A first or outer row of contact apertures 112 and a second or inner row of contact apertures 114 are provided through the bottom wall 106 in a parallel relationship to each of the longitudinal side walls 102 of the housing 100, thereby providing four rows of apertures extending from the contact cavity 108 through the bottom wall 106 to the contact interface 110. In the illustrated embodiment, each of the rows of contact apertures 112 and 114 includes thirteen contact apertures, thereby providing a fifty two (13×4) position housing 100. It is recognized, however, that greater or fewer apertures may be provided in greater or fewer rows in various alternative embodiments without departing from the scope and spirit of the present invention.

Lever slots 116 are formed in each of the longitudinal side walls 102 in communication with the contact cavity 108 (FIG. 1). The lever slots 116 are configured for receiving and maintaining an actuation lever of a mating connector (not shown) for engaging electrical contacts of the mating connector with electrical contacts (described below) in the header. Various slots and keying features 118 are provided in the longitudinal side walls 102, the lateral side walls 104, and the bottom wall 106 of the housing 100 for guiding mating portions of the mating connector to align the electrical contacts of the header and the mating connector. It is understood, however, that in alternative embodiments the lever slots 116 and/or the slots and keying features 118 may be omitted in a manual (i.e., not assisted) connector assembly.

Solder clip mounting lugs 120 extend outwardly from exterior surfaces 122 of each of the lateral side walls 104 between the longitudinal side walls 102. Alignment lugs 124 are also extended outwardly from each of the exterior surfaces 122 of the lateral side walls 104 at the corners of the housing 100. Each of the alignment lugs 124 includes a biasing rib 126 (FIG. 1) on an end surface 127 thereof. As explained below, the mounting lugs 120, the alignment lugs 124 and the alignment ribs 126 serve to locate solder clips (described below) on each of the lateral side walls 104 of the housing 100 so that surfaces of the solder clips are positioned coplanar with solder tails on the contact interface 110 (FIG. 2) of the housing 100. Troughs or slots 121 may be provided around the mounting lugs 124 for collection of skived or shaved portions of the lugs 120 as the solder clips are installed. Notches 129 are provided in the bottom end of the lateral side walls 104, and the notches are employed to retain the solder clips to the lateral side walls 104 as explained below.

Optionally, and in an exemplary embodiment, lugs 128 extend outwardly from the longitudinal side walls 102 at the corners of the housing 100. The lugs 128 may provide a keying feature for a mating connector on an exterior surface 130 of the longitudinal side walls 102. Additionally, the lugs 128 may protect the solder clips when mounted thereon. While the lugs 124 and 128 are illustrated as substantially rectangular in shape, it is recognized that other shapes of lugs 124 and 128 may be alternatively used in other embodiments of the invention.

Referring to FIG. 2, the contact interface 110 of the housing 100 includes a slotted positioning member 132 extending parallel to the longitudinal side walls 102, and one slot is provided in the positioning member 132 for each contact aperture in the outer row of apertures 112 and the inner row of apertures 114. When solder tails of the contacts (described below) are received in the respective slots of the positioning member 132, the solder tails are prevented from moving in the direction of arrow A which extends substantially parallel to a longitudinal axis 133 of the housing 100. The contact interface 110 further includes an alignment surface 134 extending upon an alignment rib 136 adjacent each of the longitudinal side walls 102. The alignment surfaces 134 are coplanar to one another and are laterally spaced from the positioning members 132 such that the positioning members 132 are located between the alignment surfaces and the respective outer row of contact apertures 112. As explained below, the alignment surfaces 134 provide a registration surface which ensures that ends of the solder tails on the contact interface 110 are coplanar to one another. Preloading of the solder tails against the alignment surfaces 134, as explained below, prevents the solder tails from moving in the direction of arrow B which extends perpendicular to the longitudinal axis 133.

In an exemplary embodiment, the positioning member 132, the alignment rib 136 and the alignment lugs 124 are integrally formed with one another. By forming the alignment rib 136 and the alignment lugs 124 in an integral fashion, the top surface 127 (FIG. 1) of the alignment lugs 124 are located a fixed distance from the alignment surfaces 134. As such, the solder clips may be precisely positioned with respect to the alignment surface as described below to achieve coplanarity of the solder clips with the alignment surfaces 134. Alternatively, the alignment rib 136, the positioning member 132, and the alignment lugs 124 may be separately fabricated and attached to the housing 100.

In an exemplary embodiment, the housing 100, including each of the aforementioned features, is integrally formed from an electrically insulative (i.e., nonconductive material), such as plastic, according to a known process, such as an injection molding process. It is recognized, however, that the housing 100 may alternatively be formed of separate pieces and from other materials as those in the art may appreciate.

Figure 3:
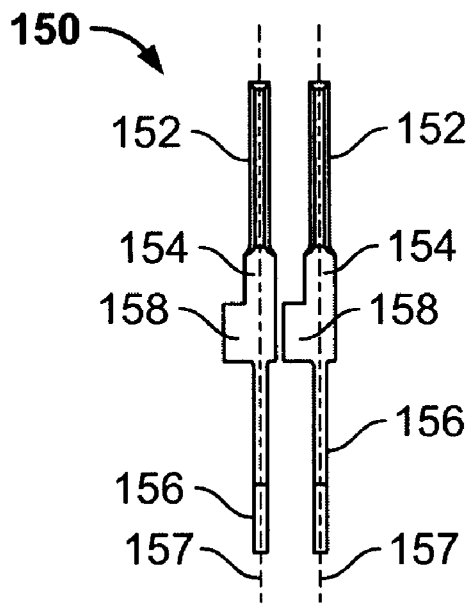
FIG. 3 is a front elevational view of a first contact assembly used with the housing shown in FIGS. 1 and 2.

FIG. 3 is front elevational view of a first contact set 150 which may be employed in the outer row of contact apertures 112 (shown in FIGS. 1 and 2) of the housing 100. In an exemplary embodiment, the contact set 150 includes contact sections 152, aperture sections 154 and solder tail sections 156. The aperture sections 154 are dimensioned to produce an interference fit when inserted into an aperture in the row of contact apertures 112, and the contact sections 152 and the solder tail sections 156 are aligned with one another along a common centerline 157.

Transverse carrier strips 158 join the aperture sections 154, and when the carrier strips 158 are sheared during assembly of the header, the contact set 150 is separated into individual contacts. While only two contacts are shown in FIG. 3, it is understood that the contact set 150 includes a number of contacts corresponding to the number of contact apertures in the contact rows 112 (shown in FIGS. 1 and 2). The contact set 150 may be fabricated from a single piece of metal, such as copper or a copper alloy, and further may be coated or plated with tin, lead, gold, etc. as necessary to obtain desired electrical and mechanical characteristics and properties of the contact set 150.

Figure 4:
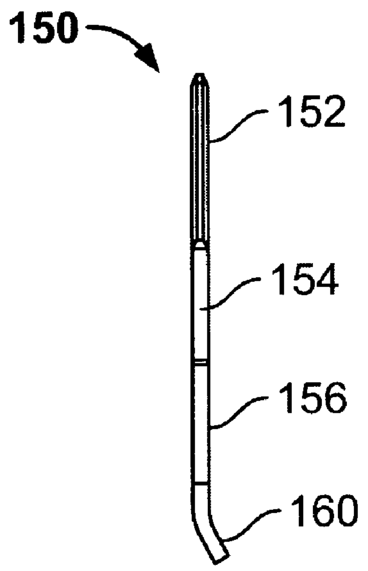
FIG. 4 is a side elevational view of the contacts shown in FIG. 3.

FIG. 4 is a side elevational view of the contact set 150 illustrating a small radius formed in an end 160 of the solder tail sections 156. The radius creates a rounded end 160 which, as will be seen below, mitigates tolerances or misalignment of the contact set 150 as the header is assembled. In an alternative embodiment, the radius may be omitted and the ends of the contact set 150 may be straight.

Figure 5:
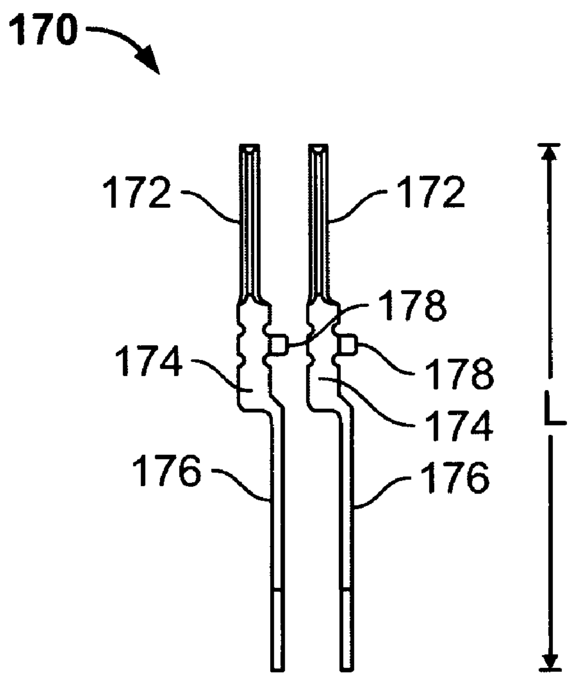
FIG. 5 is a front elevational view of a second contact assembly used with the housing shown in FIGS. 1 and 2.

FIG. 5 is a front elevational view of a second contact set 170 which may be employed in the inner row of contact apertures 114 (shown in FIGS. 1 and 2) of the housing 100. In an exemplary embodiment, the contact set 170 includes contact sections 172, aperture sections 174 and solder tail sections 176. The aperture sections 174 are shaped and dimensioned to produce an interference fit when inserted into an aperture in the row of contact apertures 114 and the contact sections 172 and the solder tail sections 176 are offset with respect to one another relative to the aperture sections 174. That is, the contact sections 172 and the solder tail sections 176 have spaced centerlines. The offset in contact sections 172 and solder tail sections 176 achieves a desired centerline spacing of the solder tail sections 176 relative to the solder tail sections 156 (shown in FIGS. 3 and 4) when the contact sets 150 and 170 are installed in the housing 100. Because the contact set 170 is installed to the inner row of contact apertures 114, the contact set 170 has a greater length L than the first contact set 150 which is installed to the outer row of contact apertures 112 in the housing 100.

Transverse carrier strips 178 join the aperture sections 174, and when the carrier strips 178 are sheared during assembly of the header, the contact set 170 is separated into individual contacts. While only two contacts are shown in FIG. 5, it is understood that the contact set 170 includes a corresponding number of contacts as there are contact apertures in the contact rows 114. The contact set 170 may be fabricated from a single piece of metal, such as copper or a copper alloy, and further may be coated or plated with tin, lead, gold, etc. as necessary to obtain desired electrical and mechanical characteristics and properties of the contact set 170.

Figure 6:
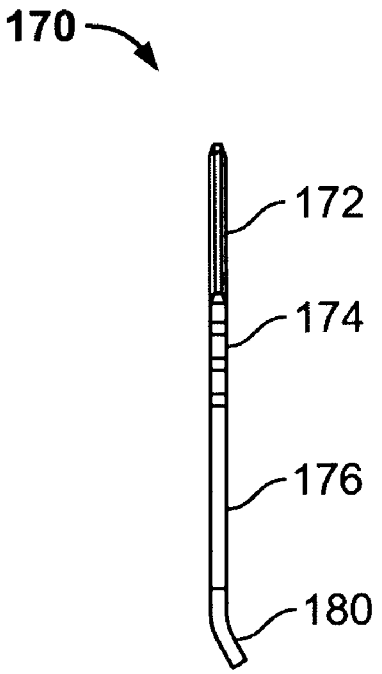
FIG. 6 is a side elevational view of the contacts shown in FIG. 5.

FIG. 6 is a side elevational view of the contact set 170 illustrating a small radius formed in an end 180 of the solder tail sections 176. The radius creates a rounded end 180 which, as will be seen below, mitigates tolerances or misalignment of the contact set 170 as the header is assembled. In an alternative embodiment, the radius may be omitted and the ends of the contact set 170 may be straight.

Figure 7:
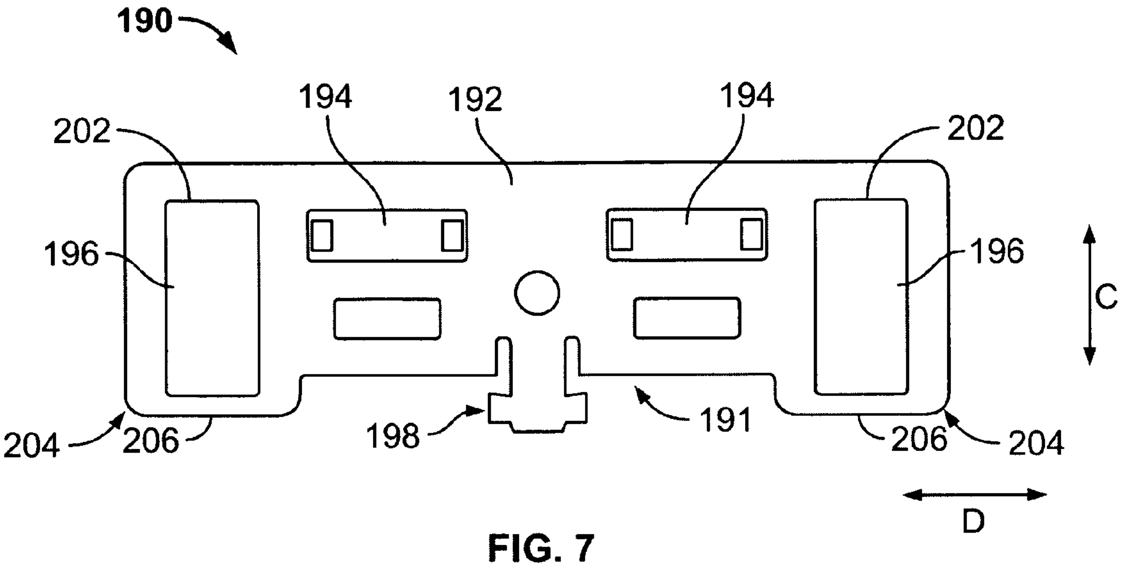
FIG. 7 is a top plan view of a solder clip formed in accordance with an exemplary embodiment of the present invention.

FIG. 7 is a top plan view of a solder clip 190 formed in accordance with an exemplary embodiment of the present invention. The clip 190 includes a main body section 192 having mounting apertures 194 and alignment apertures 196. The mounting apertures 194 are shaped and dimensioned for press fit insertion over the mounting lugs 120 of the housing 100 (shown in FIGS. 1 and 2), and the alignment apertures 196 are sized and dimensioned to receive the alignment lugs 124 (shown in FIGS. 1 and 2) of the housing 100. As such, the solder clip 190 may be aligned vertically in the direction of arrow C and horizontally in the direction of arrow D when the solder clips 190 are installed on the respective lateral walls 104 of the housing 100.

A retention tab 198 is formed on an edge 191 of the body section 192 which faces the contact interface 110 (shown in FIG. 2) of the housing 100 when the solder clip 190 is installed. The tab 198 may be folded over a lateral side wall 104 and retained in the notch 127 (shown in FIG. 2) therein. Edges 202 of the alignment apertures 196 contact the biasing ribs 126 (shown in FIG. 1) of the alignment lugs 124 of the housing 100. Assurance is therefore provided against movement of the solder clip 190 along two mutually perpendicular axes indicated by arrows C and D. Additionally, assurance is provided that the solder clip 190 is properly aligned with respect to the housing 100.

In an exemplary embodiment, the solder clip 190 is fabricated from a sheet of metal according to a stamping and forming operation. It is recognized, however, that the solder clip 190 may be fabricated from a variety of materials according to various known processes in the art in alternative embodiments.

While in an exemplary embodiment the retention tab 198 is formed in the shape of a T, it is understood that various shapes may be used in lieu of a T shape in alternative embodiments to retain the solder clip 190 to a side wall 104 of the housing 100.

Alignment tabs 204 project from the edge 191 and include solder clip board engagement surfaces 206 which are flat and smooth. The board engagement surfaces 206 contact a planar surface of a circuit board during surface mounting of the header assembly and are soldered to the circuit board. The soldering of the alignment tabs 204 provides structural strength and rigidity which provides strain relief to the soldered connections of the contact sets 150 and 170.

Figure 8:
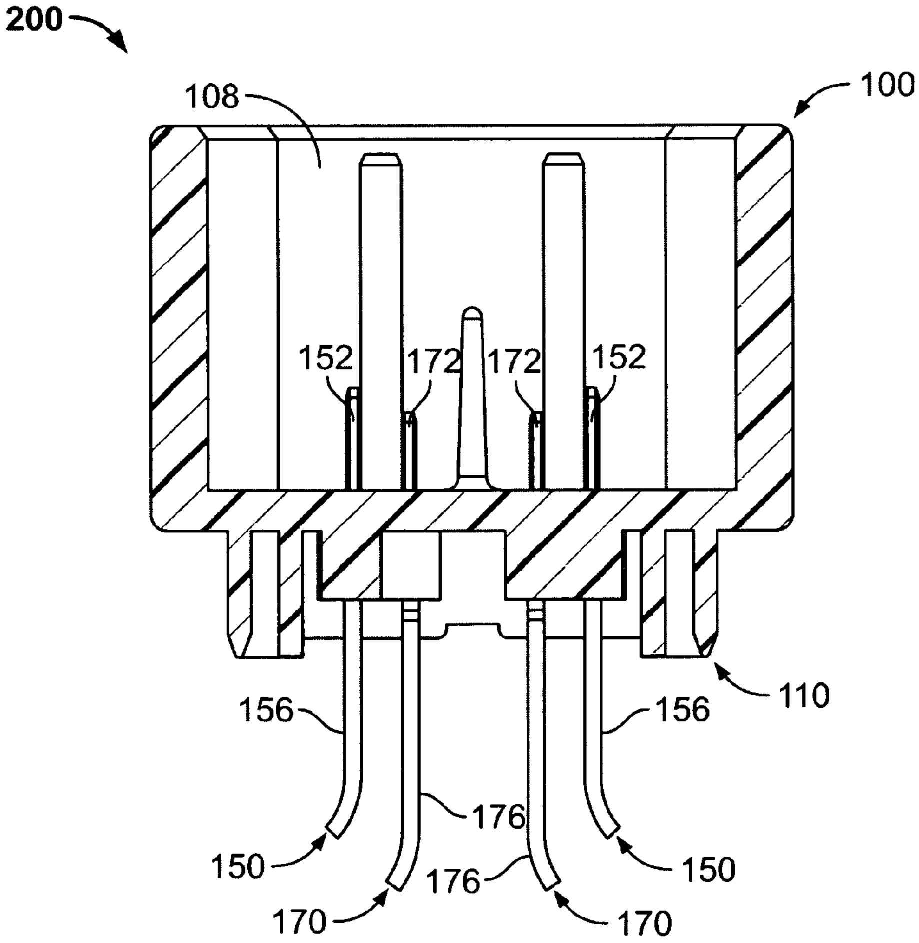
FIG. 8 is a cross sectional view of a header assembly formed in accordance with the present invention at a first stage of manufacture.

FIG. 8 is a cross sectional view of a header assembly 200 at a first stage of manufacture. The header assembly 200 includes the housing 100 with the contact sets 150 and 170 inserted into the outer and inner rows of contact apertures 112 and 114 (shown in FIGS. 1 and 2). The contact sections 152 and 172 of the respective contact sets 150 and 170 are partly located in the contact cavity 108 while the solder tail sections extend from the contact interface 110 of the housing 100.

Figure 9:
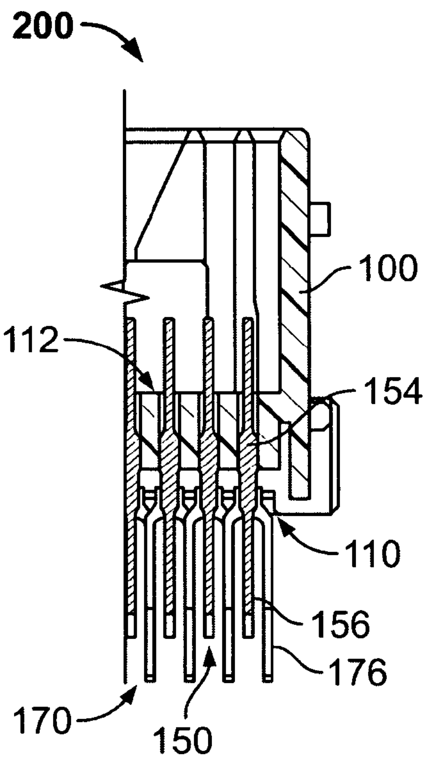
FIG. 9 is a partial cross sectional view of the header assembly shown in FIG. 8 along line 9—9 of FIG. 2.

FIG. 9 is a partial cross sectional view of the header assembly 200 through the outer row of contact apertures 112. The aperture sections 154 of the contact set 150 extend partially into the contact apertures of the row 112 for a predetermined distance, and the aperture sections 154 of the contact set 150 partly extend from the contact interface 110 of the housing 100. The carrier strips 158 (shown in FIG. 3) have been sheared from the contact set 150, thereby forming discrete contacts in the apertures in the contact aperture row 112. The solder tail sections 156 of the contact set 150 are located between the solder tail sections 176 of the contact set 170, and the centerlines of the solder tail sections 176 and 156 are consistently spaced from one another.

Figure 10:
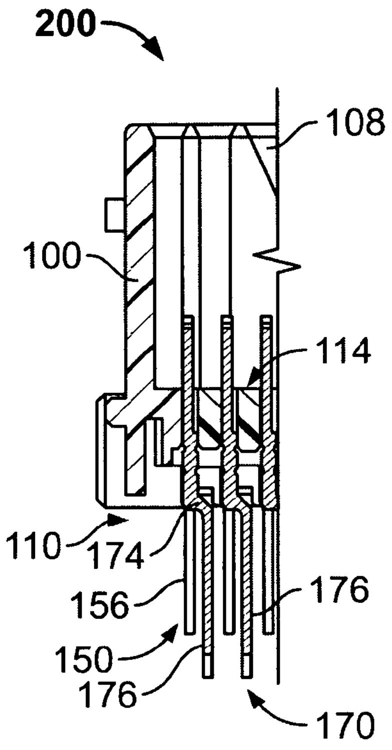
FIG. 10 is a partial cross sectional view of the header assembly shown in FIG. 8 along line 10—10 of FIG. 2.

FIG. 10 is a cross sectional view of the header assembly 200 through the inner row of contact apertures 114. The aperture sections 174 of the contact set 170 extend partially into the contact apertures of the row 114 for a predetermined distance, and the aperture sections 174 of the contact set 170 partly extend from the contact interface 110 of the housing 100. The carrier strips 178 (shown in FIG. 5) have been sheared from the contact set 170, thereby forming discrete contacts in the apertures in the contact aperture row 114. The solder tail sections 176 of the contact set 170 are located between the solder tail sections 156 of the contact set 150, and the centerlines of the solder tail sections 176 and 156 are consistently spaced from one another.

Figure 11:
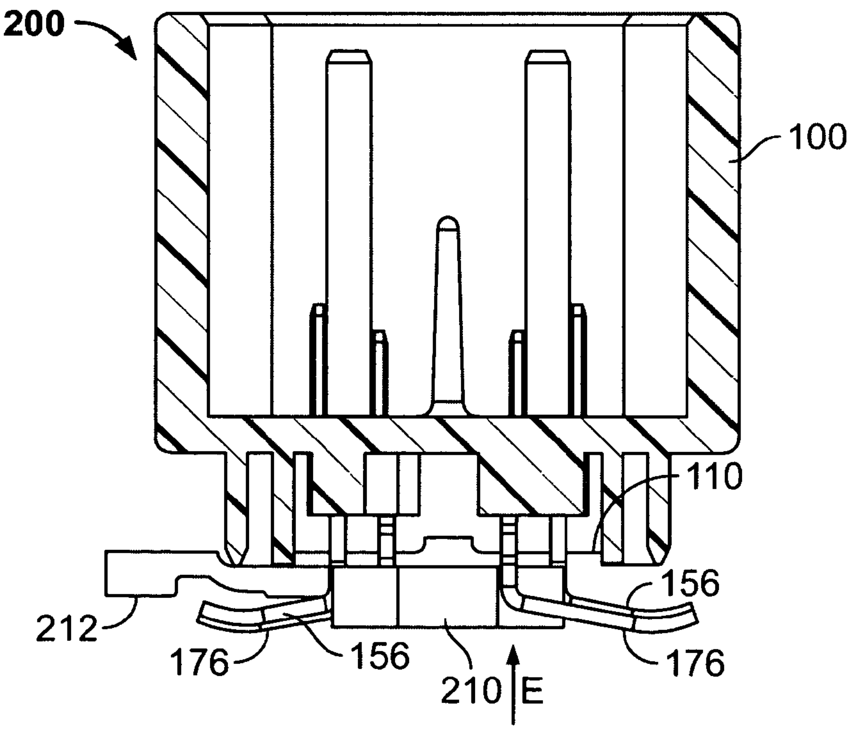
FIG. 11 is a cross sectional view of the header assembly at a second stage of manufacture.

FIG. 11 is a cross sectional view of the header assembly 200 at a second stage of manufacture wherein tooling, such as forming dies 210 and 212, is employed to bend the solder tail sections 156 and 176 toward the contact interface 110 of the housing 100. Once the forming die 212 is removed, the contacts may be further inserted through the contact interface 110 by seating the forming die 210 in the direction of arrow E to bring the bent solder tail sections 156 and 176 to the contact interface 110.

While the embodiment described thus far includes bending of the contact sets 150, 170 after they are partially installed in the housing 100, it is recognized that the contact sets 150, 170 could be bent prior to installation to the housing 100 in an alternative embodiment.

Figure 12:
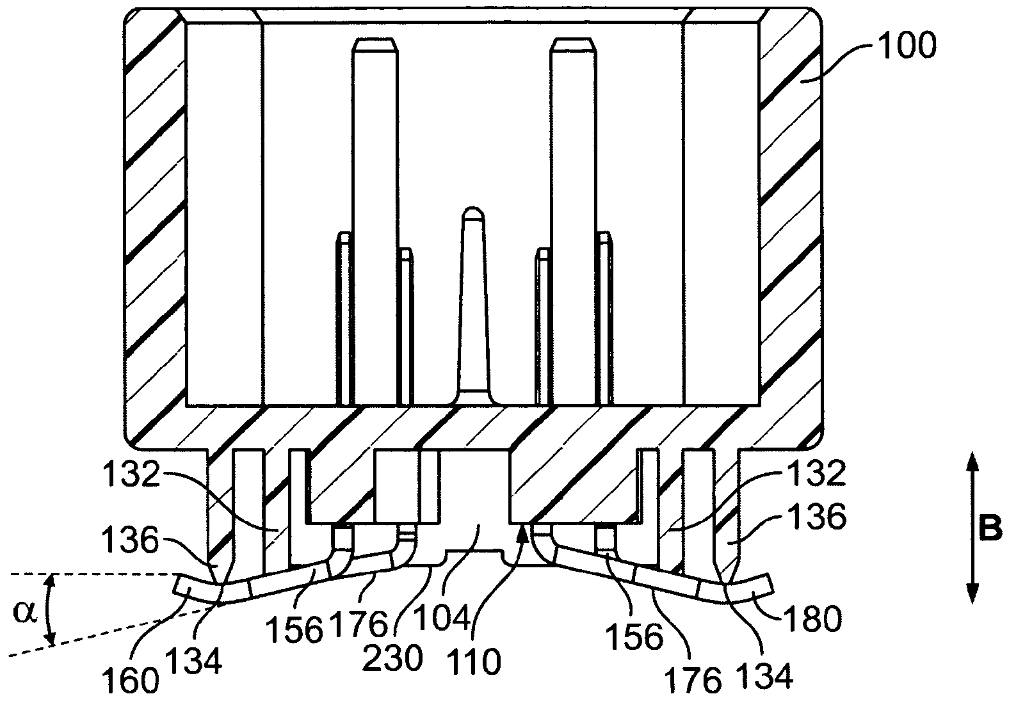
FIG. 12 is a cross sectional view of the header assembly at a third stage of manufacture.

FIG. 12 is a cross sectional view of the header assembly 200 at a third stage of manufacture wherein the aperture sections 154 and 174 (shown in FIGS. 9 and 10) are fully inserted into the respective rows of contact apertures 112 and 114 in the housing 100 to a final position. In the final position, the solder tail sections 156 and 176 are fitted through the slots in the positioning member 132 (also shown in FIG. 2), and the rounded ends 160 and 180 of the respective solder tail sections 156 and 176 are aligned with one another and in abutting contact to the alignment rib 136. As shown in FIG. 12, the alignment surface 134 is rounded or crowned and shaped to smoothly establish contact with the rounded end 160 and 180 of the contact sets 150 and 170. The solder tail sections 156 and 176 are flexed from the position shown in FIG. 11 and are obliquely oriented to the contact interface 110 of the housing 100, thereby creating in internal biasing force in the contact sets 150 and 170 which preloads the solder tail sections 156 and 176 against the alignment surfaces 134 of the alignment ribs 136. Such biasing or preloading of the solder tail sections 156 and 176 substantially prevents vertical movement of the solder tail sections 156 and 176 in the direction of arrow B as the header assembly 200 is handled prior to surface mounting and during surface mounting installation. Further, a final angle a of the solder tails 156 and 176 with respect to a top surface 230 of the lateral side walls 104 assures a satisfactory solder joint to a circuit board.

The crowned alignment surfaces 134 of the alignment ribs 136 and the rounded ends 160 and 180 of the solder tail sections 156 and 176 permits some misalignment of the solder tail sections 156 and 176 as the contact sets 150 and 170 are installed. The rounded engagement surfaces of the alignment surfaces 134 and the ends 160 and 180 of the contact sets 150 and 170 allow for shifting points of contact among the engagement surfaces as the contact sets 150 and 170 are moved to the final position. As the solder tail sections 156 and 176 are preloaded against the alignment ribs 136, relative misalignment of the solder tails is substantially, if not entirely, eliminated and the rounded ends 160 and 180 of the contact sets 150 and 170 are substantially aligned to produce coplanar contact points tangential to the rounded ends for mounting to a circuit board.

While in the illustrated embodiment the alignment surfaces 134 are crowned and the ends 160 and 180 of the contact sets 150 and 170 are rounded, it is appreciated that in an alternative embodiment the alignment surface may be substantially flat and the contact ends may be substantially straight while nonetheless aligning the contacts in a planar relationship to one another for surface mounting to a circuit board.

Figure 13:
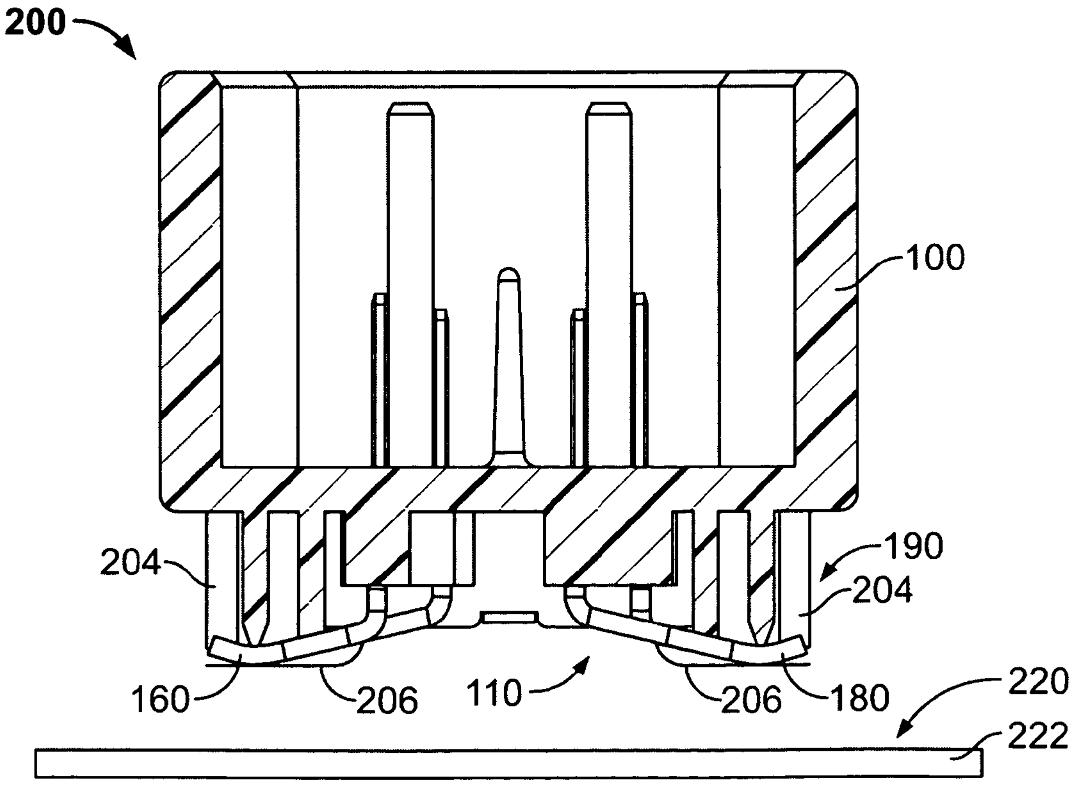
FIG. 13 is a cross sectional view of the header assembly at a final stage of manufacture.

FIG. 13 is a cross sectional view of the header assembly 200 at a final stage of manufacture wherein the solder clips 190 are attached to the housing 100. The engagement surfaces 206 of the solder clip alignment tabs 204 are coplanar with the contact ends 160, 180 of the contacts sets 150 and 170. The contact interface 110 is therefore well suited for surface mounting to a planar surface 220 of a circuit board 222.

Figure 14:
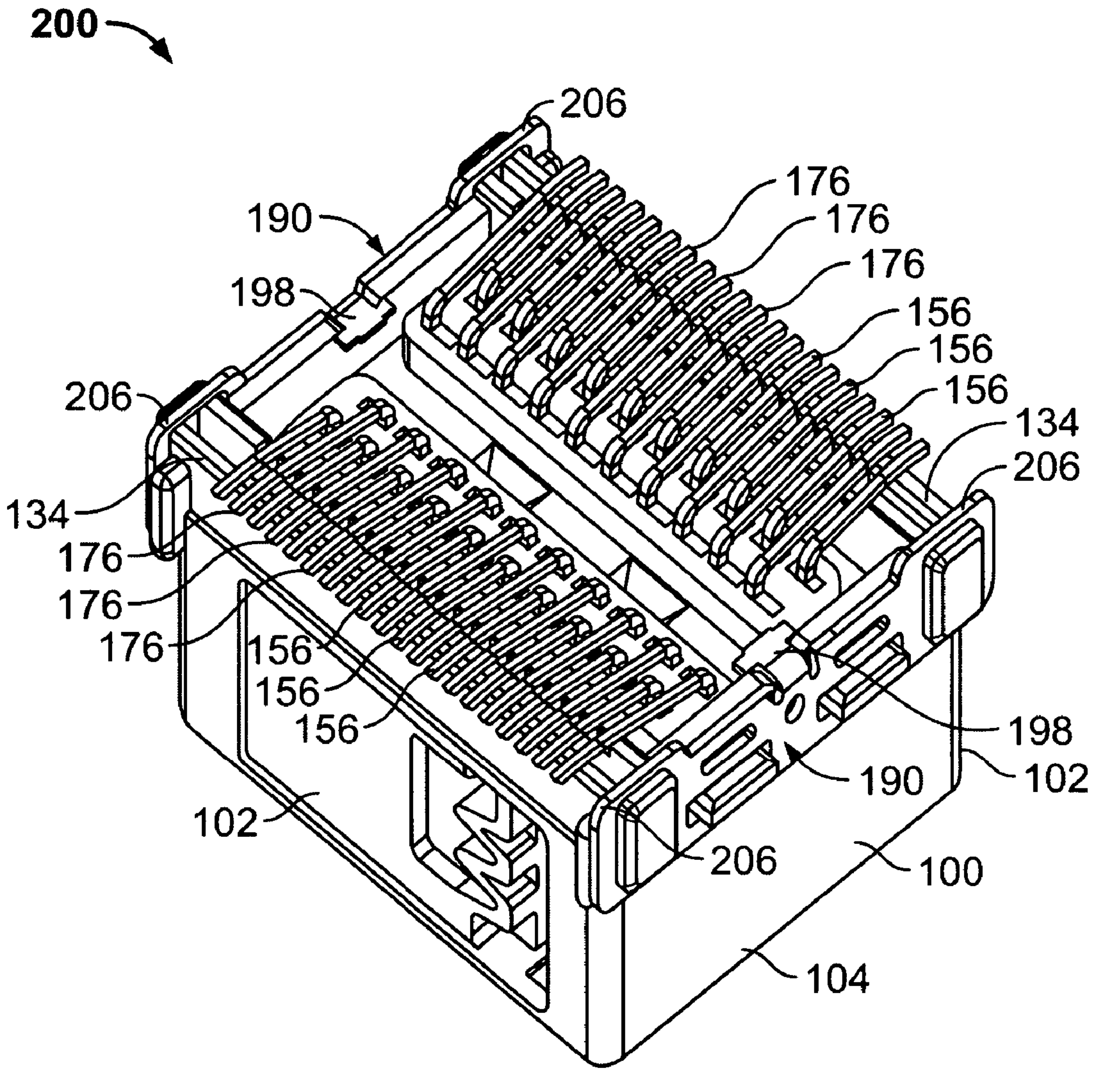
FIG. 14 is a bottom perspective view of the header assembly shown in FIG. 13.

FIG. 14 is a bottom perspective view of the header assembly 200 when completely assembled. The solder clips 190 are coupled to the lateral side walls 104 of the housing 100 and may be retained thereto by the retention tabs 198. The solder tail sections 156 and 176 are preloaded and abutted against the alignment surfaces 134 adjacent the longitudinal side walls of the housing 100. Manufacturing tolerances in fabricating the contact sets 150 and 170 are mitigated and the solder tail sections 156 and 176 are substantially aligned and coplanar for mounting to the planar surface 220 of the board 222 (shown in FIG. 13). The solder clip board alignment surfaces 206 are substantially aligned and coplanar with the solder tail sections 156 and 176 for secure mounting to the circuit board 222 in the plane of the solder tail sections 156 and 176. Relatively thin and consistent films of solder paste may therefore be used for reliably soldering the header assembly 200 to the circuit board 222.

For all the above reasons, a secure and reliable header assembly is provided for surface mounting applications which capably resists high insertion and extraction forces when the header assembly 200 is engaged and disengaged from a mating connector.

Figure 15:
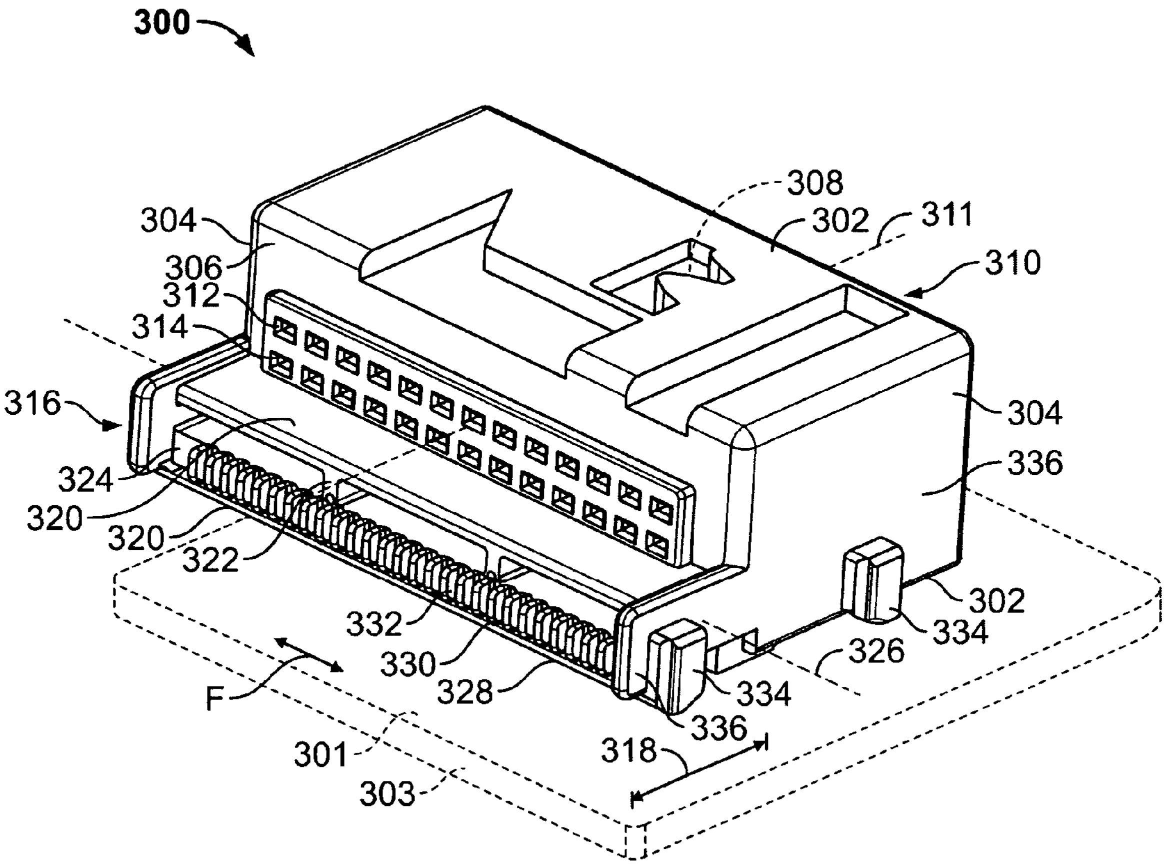
FIG. 15 is a top perspective view of an alternative housing for a surface mount header assembly formed in accordance with an alternative embodiment of the invention.
Figure 16:
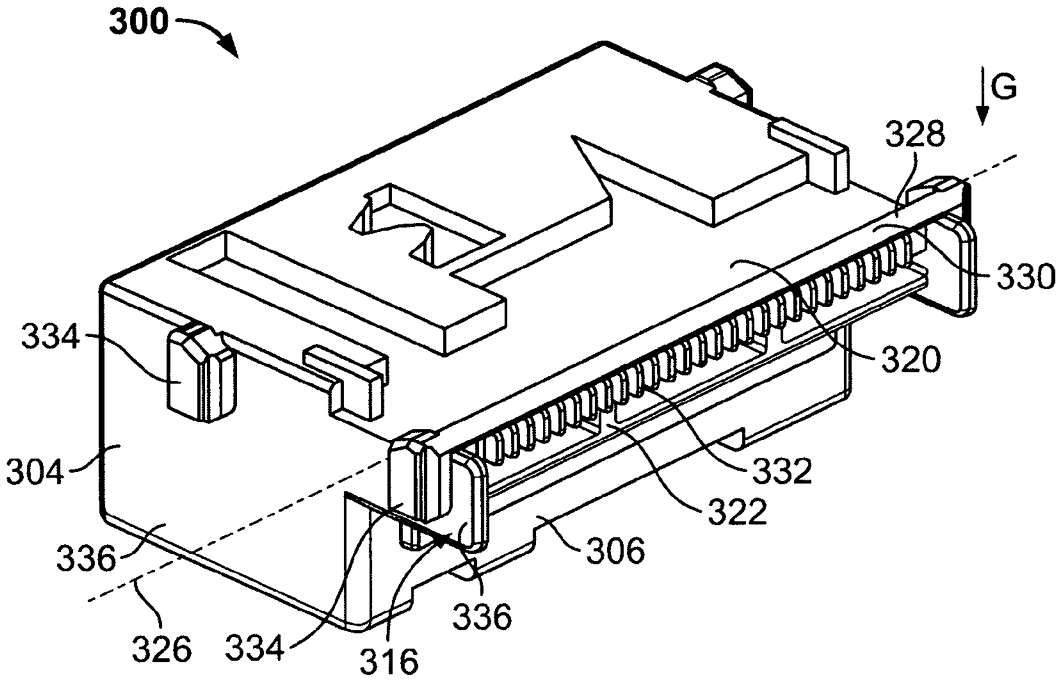
FIG. 16 is a bottom perspective view of the housing shown in FIG. 15.

FIGS. 15 and 16 are top and bottom perspective views, respectively, of an alternative housing or shroud 300 for a surface mount header assembly formed in accordance with an alternative exemplary embodiment of the invention. In some respects, the housing 300 is similar to the housing 100 described above. In the illustrated embodiment, the housing 300 is used in a right angle surface mount header assembly and may be oriented along an engagement surface 301 of a circuit board 303 (shown in phantom in FIG. 15).

Like the housing 100, the housing 300 includes a pair of longitudinal side walls 302, a pair of lateral side walls 304 extending between the ends of the longitudinal side walls 302, and a contact interface 306 extending between the longitudinal and lateral side walls 302 and 304. In the illustrated embodiment, one of the longitudinal side walls 302 is oriented along the engagement surface 301 in a spaced apart relationship when the header assembly is coupled to the circuit board 303. The side walls 302 and 304 and the contact interface 306 collectively define a contact cavity 308 within the housing 300. A plug interface 310 extends between the longitudinal and lateral side walls 302 and 304 and is generally opposed from the contact interface 306. The plug interface 310 is oriented to receive a plug assembly (not shown) and includes an opening (not shown in FIGS. 15 and 16) extending therethrough allowing access to the contact cavity 308. A cavity axis 311 extends between and is substantially perpendicular to each of the contact interface 306 and the plug interface 310. In contrast to the housing 100, the cavity axis 311 of the housing 300 is oriented substantially parallel to the engagement surface 301 of the circuit board 303.

A first or upper row of contact apertures 312 and a second or lower row of contact apertures 314 are provided through the contact interface 306 in a parallel relationship to each of the longitudinal side walls 302 of the housing 300. In the illustrated embodiment, each of the rows of contact apertures 312 and 314 includes thirteen contact apertures. It is recognized, however, that greater or fewer apertures may be provided in greater or fewer rows in various alternative embodiments without departing from the scope and spirit of the present invention.

An alignment member 316 extends a distance 318 from the contact interface 306. In the illustrated embodiment, the alignment member 316 extends from the contact interface 306 between the pair of lateral side walls 304 and between the lower row of contact apertures 314 and the longitudinal side wall 302 proximate the engagement surface 301 of the circuit board 303. The alignment member 316 includes a pair of longitudinal side walls 320 extending substantially parallel to the longitudinal side walls 302. A contact alignment wall 322 extends between the side walls 320 and is oriented substantially parallel and spaced apart from the contact interface 306.

The contact alignment wall 322 of the alignment member 316 includes a slotted positioning member 324 extending parallel to the longitudinal side walls 302, and one slot is provided in the positioning member 324 for each contact aperture in the upper row of apertures 312 and the lower row of apertures 314. When the contacts (described below) are receiving in the respective slots of the positioning member 324, the contacts are prevented from moving in the direction of arrow F which extends substantially parallel to a longitudinal axis 326 of the alignment member.

Referring to FIG. 16, the alignment member 316 further includes an alignment surface 328 extending upon an alignment rib 330 adjacent one of the longitudinal side walls 320. The alignment surface 328 includes a first portion extending substantially parallel to and spaced apart from the alignment wall 322, a second portion extending non-orthogonally or obliquely with respect to the first portion, and a transition portion extending between the first and second portions. The transition section may be curved to provide a smooth transition between the first and second portions. In the illustrated embodiment, the alignment rib 330 is positioned at a corner of the housing adjacent the longitudinal side wall 320 and oriented proximate the engagement surface 301 of the circuit board 303. The alignment surface 328 is planar and extends substantially parallel to the engagement surface 301 when the housing assembly is mounted to the circuit board 303. Moreover, the alignment surface 328 is in a spaced apart relationship with the engagement surface 301 when the housing assembly is mounted to the circuit board 303 such that the contacts may extend between the alignment surface 328 and the engagement surface 301. The alignment rib 330 and the alignment surface 328 are laterally spaced from the positioning members 332 such that the positioning members 332 are located between the alignment surface 328 and the contact interface 306 of the housing 300. As explained below, the alignment surface 328 provides a registration surface which ensures that ends of the contacts are coplanar to one another. Preloading of the contacts against the alignment surface 328, as explained below, prevent the contacts from moving in the direction of arrow G which extends perpendicular to the longitudinal axis 326.

In an exemplary embodiment, solder clip mounting lugs 334 extend outwardly from exterior surfaces 336 of each of the lateral side walls 304 and the alignment member 316. The mounting lugs 334 serve to locate solder clips (not shown) on each of the lateral side walls 304 of the housing 300 so that surfaces of the solder clips are positioned coplanar with contacts (not shown in FIGS. 15 and 16). In an alternative embodiment, board mount features, such as fasteners, or apertures for receiving fasteners, may extend outwardly from the exterior surfaces 336 to retain the housing 300 in position with respect to the circuit board 303.

In an exemplary embodiment, the housing 300 and the alignment member 316 are integrally formed with one another. Additionally, the mounting lugs 334 may be integrally formed with the housing 300 and the alignment member 316. By forming the alignment rib 330 and the alignment lugs 334 in an integral fashion, solder clips may be precisely positioned with respect to the alignment surface 328 as described below to achieve coplanarity of the contacts with the alignment surface 328. Alternatively, the alignment member 316, the alignment rib 330, and the mounting lugs 334 may be separately fabricated and attached to the housing 300.

In an exemplary embodiment, the housing 300, including each of the aforementioned features, is integrally formed from an electrically insulative (i.e., nonconductive) material, such as plastic, according to a known process, such as an injection molding process. It is recognized, however, that the housing 300 may alternatively be formed of separate pieces and from other materials as those in the art may appreciate.

Figure 17:
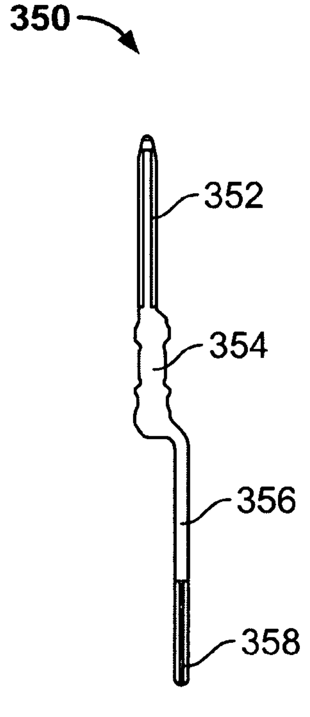
FIG. 17 is a side elevational view of a first contact used with the housing shown in FIGS. 15 and 16.

FIG. 17 is a side elevational view of a first contact 350 which may be employed in the upper row of contact apertures 312 (shown in FIG. 15) of the housing 300. In an exemplary embodiment, the contact 350 includes a contact section 352, an aperture section 354, a forming section 356, and a solder tail section 358. The forming section 356 may be bent and/or manipulated during assembly of the header assembly to substantially orient the contact in position relative to the housing 300 and/or the alignment rib 330 (shown in FIGS. 15 and 16). The aperture section 354 is dimensioned to produce an interference fit when inserted into an aperture in the upper row of contact apertures 312, and the contact section 352 and the forming section 356 are offset with respect to one another relative to the aperture sections 354. That is, the contact sections 352 and the forming sections 356 have spaced centerlines. The offset in contact sections 352 and forming sections 356 achieves a desired centerline spacing of the forming sections 356, and thus the solder tail sections 358, relative to the housing 300 and the upper row of contact apertures 312 (shown in FIG. 15) when the contacts 350 are installed in the housing 300.

While a single contact 350 is shown in FIG. 17, it is understood that the contact 350 is part of a contact set including a number of contacts corresponding to the number of contact apertures in the contact rows 312 (shown in FIG. 15). The contact set may be fabricated from a single piece of metal, such as copper or a copper alloy, and further may be coated or plated with tin, lead, gold, etc. as necessary to obtain desired electrical and mechanical characteristics and properties of the contact set.

Figure 18:
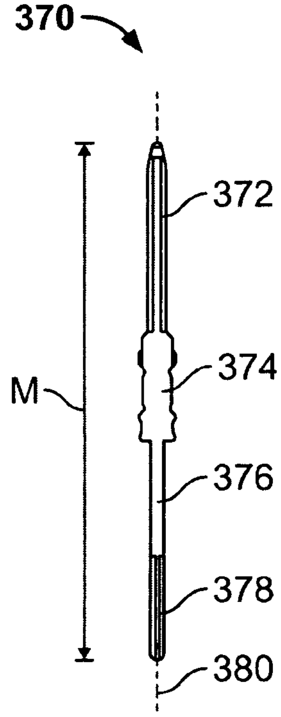
FIG. 18 is a side elevational view of a second contact used with the housing shown in FIGS. 15 and 16.

FIG. 18 is a side elevational view of a second contact 370 which may be employed in the lower row of contact apertures 314 (shown in FIG. 15) of the housing 300. In an exemplary embodiment, the contact 370 includes a contact section 372, an aperture section 374, a forming section 376, and a solder tail section 378. The forming section 376 may be bent and/or manipulated during assembly of the header assembly to substantially orient the contact in position relative to the housing 300 and/or the alignment rib 330 (shown in FIGS. 15 and 16). The aperture section 374 is shaped and dimensioned to produce an interference fit when inserted into an aperture in the row of contact apertures 314 and the contact section 372 and the forming section 376 are aligned with one another along a common centerline 380. Because the contact 370 is installed to the lower row of contact apertures 314, the contact 370 is relatively closer to the alignment rib 330 (shown in FIGS. 15 and 16). Thus, the second contact 370 has a shorter length M than the first contact 350 which is installed to the upper row of contact apertures 312 in the housing 300.

While a single contact is shown in FIG. 18, it is understood that the contact 370 is part of a contact set including a corresponding number of contacts as there are contact apertures in the contact rows 314. The contact set may be fabricated from a single piece of metal, such as copper or a copper alloy, and further may be coated or plated with tin, lead, gold, etc. as necessary to obtain desired electrical and mechanical characteristics and properties of the contact set.

Figure 19:
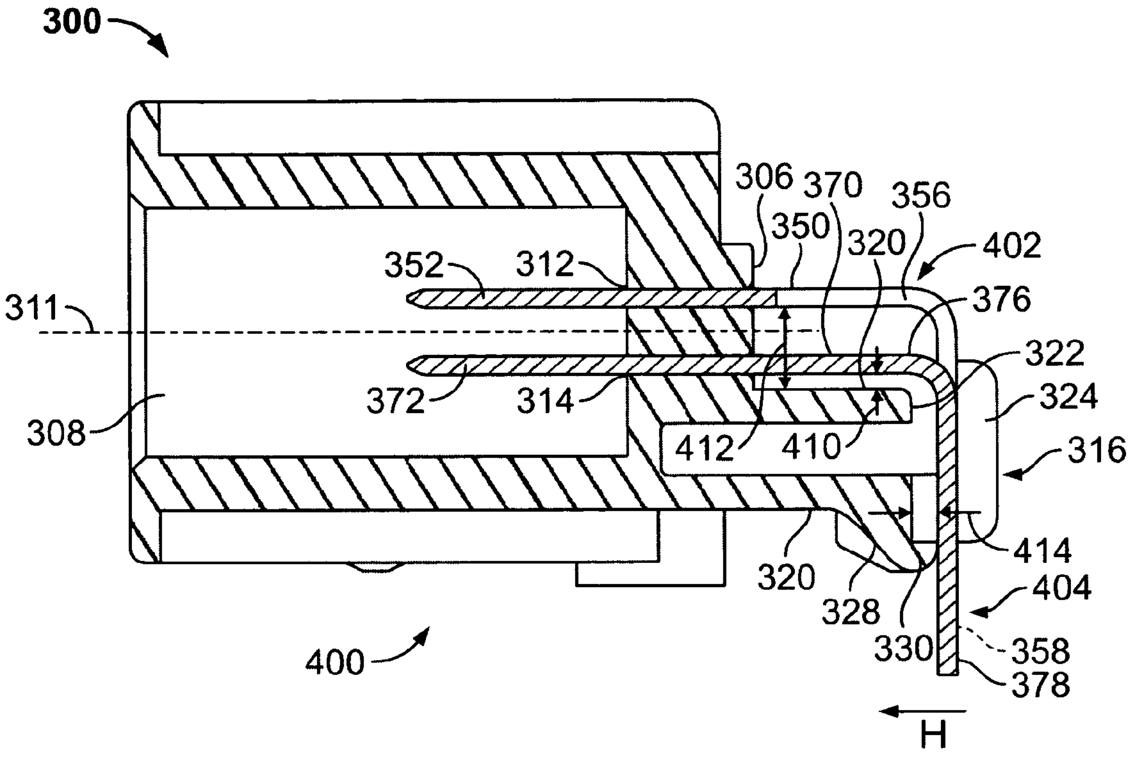
FIG. 19 is a cross sectional view of a header assembly formed in accordance with an alternative embodiment of the present invention at a first stage of manufacture.

FIG. 19 is a cross sectional view of a header assembly 400 formed in accordance with an alternative embodiment of the present invention at a first stage of manufacture. The header assembly 400 includes the housing 300 with the contacts 350 and 370 inserted into the upper and lower rows of contact apertures 312 and 314 (shown in FIG. 15) parallel to the cavity axis 311. The contact sections 352 and 372 of the respective contacts 350 and 370 are located in the contact cavity 308 while the forming sections 356 and 376 and the solder tail sections 358 and 378 extend from the contact interface 306 of the housing 300.

In the illustrated embodiment, an upper portion 402 of each forming section 356 and 376 is bent to an angle of approximately ninety degrees, such that each solder tail section 358 and 378 is substantially perpendicular to each contact section 352 and 372. In an exemplary embodiment, the upper portion 402 of each forming section 356 and 376 is bent to an angle slightly greater than ninety degrees to ensure that a lower portion or distal end 404 of each forming section 356 and 376 contacts the alignment rib 330. Moreover, by bending the forming sections 356 and 376 to an angle greater than ninety degrees, the contacts 350 and 370 are preloaded against the alignment rib 330 when the contacts 350 and 370 are installed into the housing 300. As such, in the first stage of manufacture, the header assembly includes contacts 350 and 370 having a first bend such that a portion of the contacts 350 and 370 extends substantially parallel to the cavity axis 311 both interior and exterior to the contact cavity 308, and a portion of the contacts 350 and 370 extends substantially perpendicular to the cavity axis 311 toward the alignment rib 330.

In one embodiment, tooling, such as forming dies (not shown), is employed to bend the forming sections 356 and 376 toward the alignment member 316 and alignment rib 330 prior to fully inserting the contacts 350 and 370 into the housing 300. Once the forming die is removed, the contacts 350 and 370 may be further inserted through the contact interface 306 by seating the forming die in the direction of arrow H to bring the lower portion 404 of each contact 350 and 370 in contact with the alignment rib 330. Moreover, when the contacts 350 and 370 are further inserted through the contact interface 306 the forming sections 356 and 376 are fitted through the slots in the positioning member 324 (also shown in FIGS. 15 and 16), and the solder tail sections 358 and 378 are aligned with one another and in abutting contact to the alignment rib 330. Alternatively, the contacts 350 and 370 are pre-bent prior to loading into the contact apertures 312 and 314.

While the embodiment described thus far includes bending of the contact sets after they are partially installed in the housing 300, it is recognized that the contact sets could be bent prior to installation to the housing 300 in an alternative embodiment.

In the illustrated embodiment, the lower contact 370 is positioned a distance 410 from an outer surface of the upper longitudinal side wall 320 such that a gap is defined between the lower contact 370 and the side wall 320. The upper contact 350 is positioned a distance 412 from the outer surface of the upper longitudinal side wall 320 such that a gap is defined between the upper contact 350 and the side wall 320. The distance 412 is greater than the distance 410. Moreover, each contact 350 and 370 is positioned a distance 414 from an outer surface of the contact alignment wall 322 such that a gap is defined between each contact 350 and 370 and the alignment wall 322. The gap is defined from the upper side wall 320 to the alignment rib 330. In other words, the alignment rib 330 substantially fills the lower end of the gap defined between the contacts 350 and 370 and the alignment wall 322.

Figure 20:
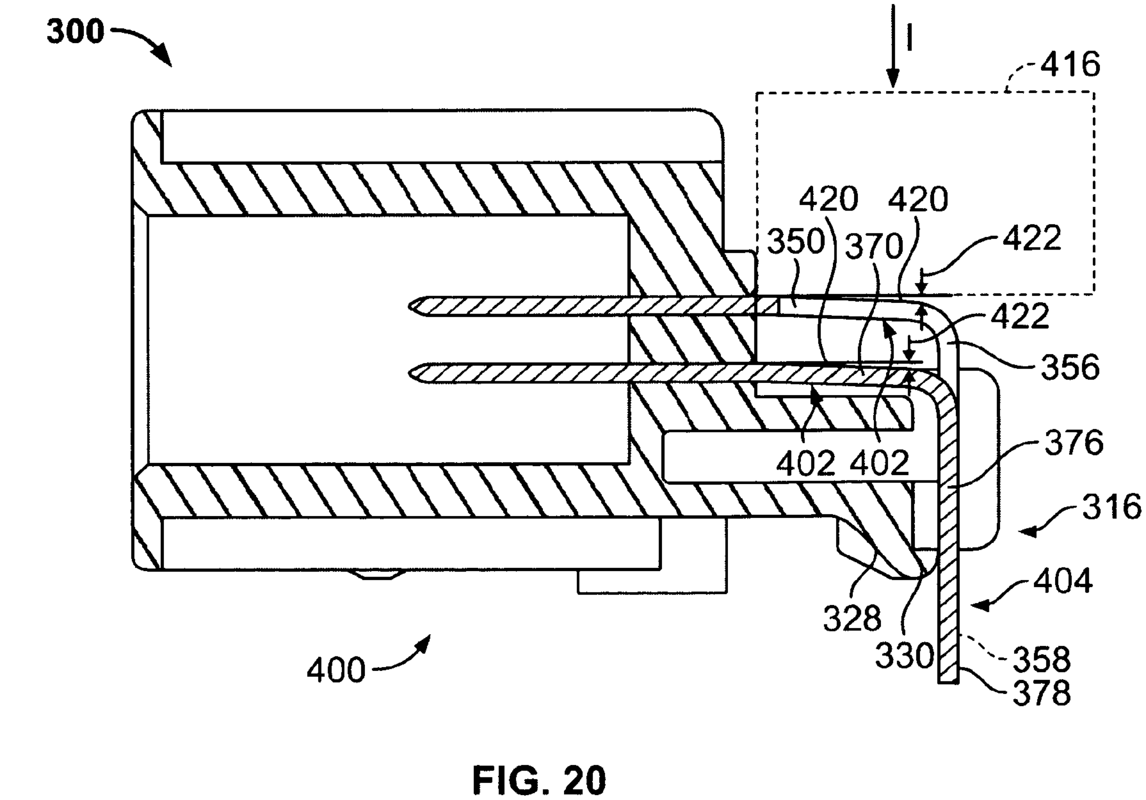
FIG. 20 is a cross sectional view of the header assembly shown in FIG. 19 at a second stage of manufacture.

FIG. 20 is a cross sectional view of the header assembly 400 at a second stage of manufacture wherein the forming sections 356 and 376 are flexed or deflected toward the alignment member 316, and specifically toward the side wall 320. Moreover, the gap defined between the outer surfaces of the alignment member and the contacts 350 and 370 allow the contacts 350 and 370 to be deflected. In an exemplary embodiment, the contacts 350 and 370 are deflected using a tool 416, such as forming dies, shown in phantom in FIG. 20. Specifically, a force is applied to a top surface 420 of each of the contacts 350 and 370 near the upper portion 402 thereof to displace the contacts 350 and 370 a distance 422 in the direction of arrow I, thus lowering the lower portion 404 of the contacts a similar distance with respect to the alignment surface 328 of the alignment rib 330. Moreover, the force applied to the contacts 350 and 370 flexes the contacts 350 and 370, but does not permanently bend the contacts 350 and 370. Specifically, the contacts 350 and 370 are capable of releasing or unflexing toward the original or un-deflected position once the force is removed from the contacts 350 and 370.

Figure 21:
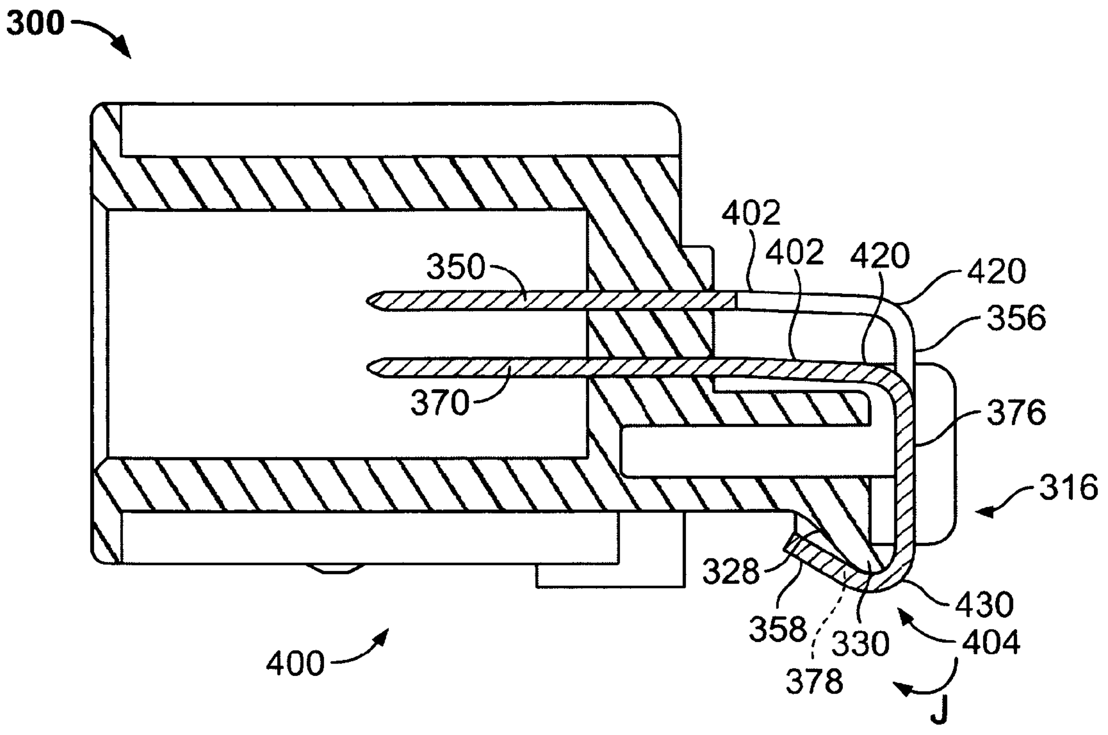
FIG. 21 is a cross sectional view of the header assembly shown in FIG. 19 at a third stage of manufacture.

FIG. 21 is a cross sectional view of the header assembly 400 at a third stage of manufacture wherein the forming sections 356 and 376 are formed against the alignment rib 330. In an exemplary embodiment, the alignment surface 328 is rounded or crowned and shaped to smoothly establish contact with the forming sections 356 and 376 and the solder tail sections 358 and 378. During forming, the solder tail sections 358 and 378 are bent inwardly toward the alignment surface 328 and upwardly along the alignment surface 328, in a generally clockwise direction, such as in the direction of arrow J. In one embodiment, the solder tail sections are bent using tooling such as a forming die (not shown). As a result, the contacts 350 and 370 have a curved shape with the forming sections 356 and 376 and the solder tail sections 358 and 378 having a rounded or cradled portion 430 that substantially surrounds the alignment member 316.

When formed, at least a portion of the contacts 350 and 370 abut the alignment member 316. Specifically, the lower portion 404 of the forming sections 356 and 376 and at least a portion of the solder tail section 358 and 378 engage the alignment rib 330 during the forming process. The rounded portion 430 defines the lower most portion of the contact 350 and 370 and is the portion of the contact 350 and 370 that engages and is soldered to the engagement surface 301 (shown in FIG. 15) of the circuit board 303 (shown in FIG. 15). As such, in the third stage of manufacture, the header assembly includes contacts 350 and 370 having a first bend and a second bend such that a portion of the contacts 350 and 370 extends substantially parallel to the cavity axis 311 both interior and exterior to the contact cavity 308. A portion of the contacts 350 and 370 extends substantially perpendicular to the cavity axis 311 toward the alignment rib 330. A portion of the contacts 350 and 370 extends obliquely with respect to the cavity axis along a portion of the alignment rib 330.

As illustrated in FIG. 21, when the forming sections 356 and 376 are formed against the alignment rib 330, the contacts 350 and 370 are in the deflected position such that the upper portion 402 of each contact 350 and 370 is displaced in the direction of the alignment member 316. However, during forming and in the third stage of manufacture, each contact 350 and 370 may be formed slightly differently due to variations in the yield strengths of each contact 350 and 370, such that each contact 350 and 370 may have a slightly different bend or radius of curvature. Additionally, each contact 350 and 370 may abut the alignment rib 330 in a slightly different location along the rib 330. However, as described below, these variations are accommodated for when the force applied to the top surface 420 of each contact 350 and 370 is released such that, in the fully assembled state as described in detail below, each contact 350 and 370 abuts the alignment rib 330 in a coplanar relation to one another.

Figure 22:
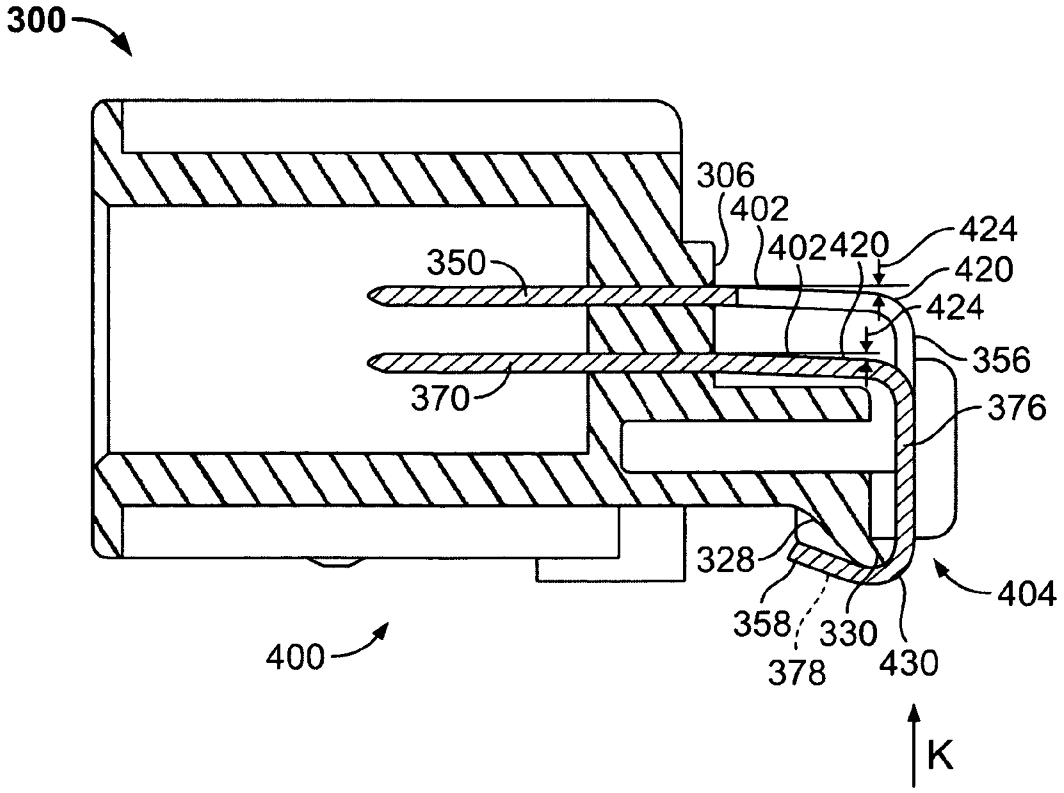
FIG. 22 is a cross sectional view of the header assembly shown in FIG. 19 at a fourth stage of manufacture.

FIG. 22 is a cross sectional view of the header assembly 400 at a fourth and final stage of manufacture wherein the contacts 350 and 370 are biased, or pre-loaded, against the alignment rib 330, thereby ensuring coplanarity of each of the contacts 350 and 370 for surface mounting to the circuit board 303 (shown in FIG. 15). In this stage of manufacture, the force applied to the top surface 420 of each contact 350 and 370 near the upper portion 402 thereof at the second stage of manufacture (shown in FIG. 20) is removed or released. As such, the contacts 350 and 370 attempt to return to the original or un-deflected position. However, as the solder tail sections 358 and 378 and the lower portion 404 of the forming sections 356 and 376 have been formed against and partially surround the alignment rib 330, the contacts 350 and 370 are prevented from returning to a fully un-deflected position, as illustrated in FIG. 19. As such, the contacts 350 and 370 may be partially deflected a distance 424, wherein the distance 424 is smaller than the distance 422 (shown in FIG. 20).

When the force is no longer applied to the contacts 350 and 370, the solder tail sections 358 and 378 and the lower portion 404 of the forming sections 356 and 376 become more fully seated against the alignment rib 330. Specifically, the solder tail sections 358 and 378 and the lower portion 404 of the forming sections 356 and 376 abut against the alignment rib 330 and remain under load in the direction of arrow K as the contacts 350 and 370 attempt to return to the original un-deflected position. Specifically, the upper portion 402 of each forming section 356 and 376 remains partially deflected from the position shown in FIG. 19 and is obliquely oriented to the contact interface 306 of the housing 300, thereby creating an internal biasing force in the contacts 350 and 370 which preloads the solder tail sections 358 and 378 and the lower portion 404 of the forming sections 356 and 376 against the alignment surface 328 of the alignment rib 330. Such biasing or preloading substantially prevents vertical movement of the forming sections 356 and 376 and the solder tail sections 358 and 378 in the direction of arrow K as the header assembly 400 is handled prior to surface mounting and during surface mounting installation. Further, the portion of each solder tail section 358 and 378 obliquely extending and upwardly sloped from the engagement surface 301 (shown in FIG. 15) assures a satisfactory solder joint to the circuit board 303.

When the force is removed, the contacts 350 and 370 are each seated against the alignment surface 328 in a substantially similar position such that the rounded portions 430 of the contacts are substantially aligned and coplanar with one another. The crowned alignment surfaces 328 of the alignment ribs 330 and the rounded portions 430 of the contacts 350 and 370 permits some misalignment of the contacts 350 and 370 when installed. The rounded alignment surface 328 and the rounded portions 430 of the contacts 350 and 370 allow for shifting points of contact among the surfaces 301 as the contacts 350 and 370 are moved to the final position. As the contacts 350 and 370 are preloaded against the alignment rib 330, relative misalignment of the forming sections 356 and 376 and the solder tail sections 358 and 378 is substantially, if not entirely, eliminated and the rounded portions 430 are substantially aligned to produce coplanar contact points tangential to the rounded portions 430 for mounting to the circuit board 303.

While in the illustrated embodiment the alignment surface 328 is crowned and the rounded portions 430 are curved, it is appreciated that in an alternative embodiment the alignment surface 328 may be substantially flat and the rounded portions 430 may be substantially straight while nonetheless aligning the contacts 350 and 370 in a planar relationship to one another for surface mounting to the circuit board 303.

Figure 23:
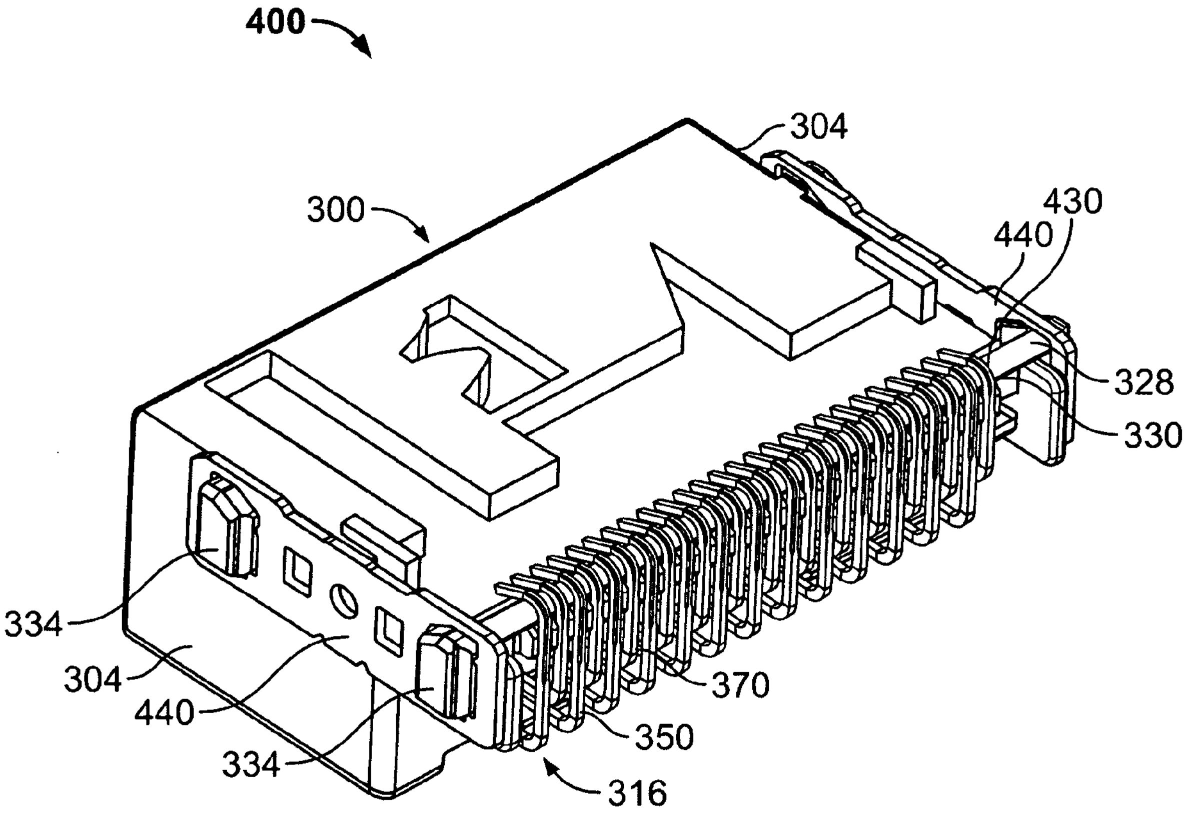
FIG. 23 is a bottom perspective view of the header assembly shown in FIG. 19.
Figure 24:
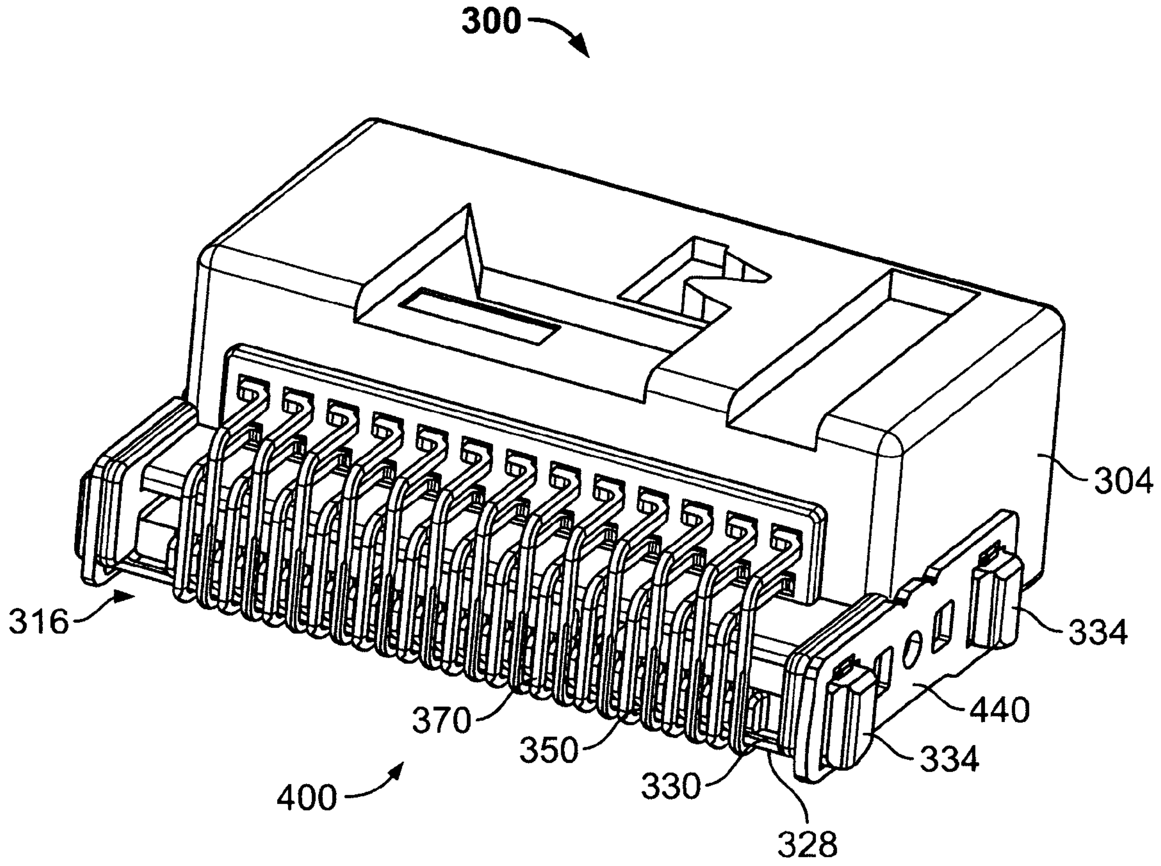
FIG. 24 is a top perspective view of the header assembly shown in FIG. 19.

FIGS. 23 and 24 are bottom and top perspective views, respectively, of the header assembly 400 when completely assembled. Solder clips 440 are coupled to the lateral side walls 304 of the housing 300 and the alignment member 316, and aligned thereon by the mounting lugs 334. Specifically, the solder clips 440 engage a ramped portion of the mounting lugs 334 such that the bottom portion of the solder clips 440 are substantially aligned and coplanar with the rounded portions 430 of the contacts 350 and 370. Optionally, the solder clips 440 may include retention features engaging the mounting lugs 334 and securing the solder 440 with respect to the mounting lugs 334.

The contacts 350 and 370 are preloaded and abutted against the alignment surface 328 adjacent the bottom edge of the alignment member 316. Manufacturing tolerances in fabricating the contacts 350 and 370 are mitigated and the rounded portions 430 are substantially aligned and coplanar for mounting to the engagement surface 301 (shown in FIG. 15) of the circuit board 303 (shown in FIG. 15). Relatively thin and consistent films of solder paste may therefore be used for reliably soldering the header assembly 400 to the circuit board 303. In an alternative embodiment, the contacts 350 and 370 have different thicknesses. As such, the alignment rib 330 is stepped to accommodate the different sized contacts 350 and 370. Accordingly, the rounded portions 430 of each contact 350 and 370 are substantially aligned and coplanar.

For all the above reasons, a secure and reliable header assembly is provided for surface mounting applications which capably resists high insertion and extraction forces when the header assembly 400 is engaged and disengaged from a mating connector.

While the invention has been described in terms of various specific embodiments, those skilled in the art will recognize that the invention can be practiced with modification within the spirit and scope of the claims.

What is claimed is:

1. A header assembly comprising:

an insulative housing mountable to a circuit board and comprising a plurality of walls defining an interior cavity extending along a mating axis and said insulative housing comprising an alignment rib extending along an exterior surface thereof in a direction substantially perpendicular to said mating axis, wherein said alignment rib extends parallel to and spaced apart from the circuit board such that a gap is formed between said alignment rib and the circuit board; and a plurality of contacts within said cavity and extending through one of said walls to an exterior of said housing for surface mounting to a circuit board, said contacts formed against and abutting said alignment rib such that said contacts substantially fill the gap formed between said alignment rib and the circuit board when said insulative housing is mounted to the circuit board.

2. A header assembly in accordance with claim 1 wherein each of said contacts includes a first bend and a second bend, one of said first and second bends being approximately 90°.

3. A header assembly in accordance with claim 1 wherein each of said contacts includes a first bend and a second bend, one of said first and second bends being greater than 90°.

4. A header assembly in accordance with claim 1 wherein said contacts extend parallel to said mating axis within said cavity, substantially perpendicular to said mating axis exterior to said cavity, and oblique to said mating axis adjacent said alignment rib.

5. A header assembly in accordance with claim 1 wherein said contacts are preloaded against said alignment rib at an outer corner of said housing.

6. A header assembly in accordance with claim 1 further comprising a solder clip comprising a substantially flat engagement surface for surface mounting to the circuit board, said engagement surface coplanar with said contacts.

7. A header assembly in accordance with claim 1 further comprising an alignment member having an upper surface, a lower surface, and an outer wall extending therebetween, said outer wall substantially parallel to and spaced apart from one of said plurality of walls of said housing, said alignment rib extending outwardly from each of said outer wall and lower surface to define a corner of said housing.

8. A header assembly in accordance with claim 1 further comprising an alignment member having an upper surface, a lower surface, and an outer wall extending therebetween, said alignment rib extending outwardly from a corner of said alignment member defined by the intersection of said lower surface and said outer wall, said contacts spaced apart from said upper surface and said outer wall such that a gap is defined between said contacts and each of said upper surface and said outer wall.

9. A header assembly in accordance with claim 1 further comprising an alignment member, said contacts spaced apart from said alignment member such that a gap is defined between said contacts and said alignment member, said contacts deflected in the direction of said alignment rib towards said alignment member within the gap.

10. A header assembly in accordance with claim 1 wherein said contacts include rounded ends and said alignment rib comprises a crowned surface, said rounded ends engaging said crowned surface as said contacts are preloaded, all of said contacts arranged on a single edge of said alignment rib.

11. A header assembly for engaging an engagement surface of a circuit board, said header assembly comprising:

an insulative housing mountable to the circuit board, said insulative housing comprising a plurality of walls defining an interior cavity and a contact interface opposite a plug interface, and at least one alignment rib at an exterior corner of said housing; and a plurality of contacts having contact sections and solder tail sections, said contact sections located within said interior cavity, said solder tail sections extending exterior to said contact interface for surface mounting to a circuit board at mounting portions of said solder tail section, wherein said mounting portions of said solder tail sections abut said alignment rib such that said mounting portions are sandwiched between said alignment rib and the circuit board when said alignment housing is mounted to the circuit board, and said solder tail sections are preloaded against said alignment rib as said contacts are installed into said housing, thereby ensuring coplanarity of said solder tail sections for surface mounting to the circuit board.

12. A header assembly in accordance with claim 11 further comprising a cavity axis extending through said contact interface and said plug interface, said cavity axis substantially parallel to the engagement surface of the circuit board.

13. A header assembly in accordance with claim 12 wherein said alignment rib extends substantially perpendicular to said cavity axis at a corner of said housing.

14. A header assembly in accordance with claim 11 further comprising an alignment member, said contacts spaced apart from said alignment member such that a gap is defined between said contacts and said alignment member, said contacts deflected in the direction of said alignment rib towards said alignment member within the gap.

15. A header assembly in accordance with claim 11 wherein said alignment rib comprises a plurality of non-orthogonal surfaces, said contacts engaging at least two non-orthogonal surfaces of said alignment rib.

16. A header assembly in accordance with claim 11 wherein said alignment rib comprises a crowned surface, said solder tail sections abutting said crowned surface.

17. A method of assembling a surface mount header assembly, the assembly including an insulative housing including a plurality of walls defining an interior surface, an exterior surface and a plurality of contact apertures extending therebetween, the housing further including an alignment member extending from the exterior surface, the alignment member including at least one alignment rib extending on an exterior corner thereof, and the assembly further including a plurality of electrical contacts for surface mounting to a circuit board at mounting portions of the contacts, the method comprising:

inserting the contacts through the contact apertures;

forming an approximately right angle bend in said contacts; and forming the contact around the alignment rib such that the mounting portions of the contacts abut the alignment rib and are preloaded against the alignment rib in a coplanar relationship with one another along a single edge of the housing for surface mounting to the circuit board.

18. A method in accordance with claim 17 wherein said forming the contact around the alignment rib further comprises:

resiliently deflecting the contacts such that a distal end of each contact is displaced from the alignment rib; and bending the distal end of the contacts against the alignment rib such that an end portion of each contact is formed around the alignment rib.

19. A method in accordance with claim 17 further comprising orienting the contacts proximate the alignment member such that a gap is provided between the contacts and the alignment member such that the contact may be deflected in the direction of the alignment rib.

20. A method in accordance with claim 17 wherein said forming the contact around the alignment rib further comprises:

resiliently deflecting the contacts such that a distal end of each contact is displaced from the alignment rib;

forming the contacts against the alignment rib such that an end portion of each contact is formed around the alignment rib; and releasing the contacts, wherein the contacts return toward an original position and the distal ends are secured to the alignment rib, thereby ensuring coplanarity of the contacts along the alignment rib.

* * * * *